United States Patent [19]

Narumiya et al.

[11] Patent Number: 4,690,778
[45] Date of Patent: Sep. 1, 1987

[54] ELECTROMAGNETIC SHIELDING MATERIAL

[75] Inventors: Yoshikazu Narumiya; Yasuo Hashimoto, both of Chiba; Hiroshi Yui; Yoshiteru Kageyama, both of Mie, all of Japan

[73] Assignee: TDK Corporation, Tokyo, Japan

[21] Appl. No.: 735,955

[22] Filed: May 20, 1985

[30] Foreign Application Priority Data

May 24, 1984 [JP] Japan .................. 59-103669

[51] Int. Cl.$^4$ .............................. H01B 1/06
[52] U.S. Cl. .................. 252/506; 252/511; 523/137; 524/435; 524/495; 428/447
[58] Field of Search .............. 428/447; 523/137; 524/435, 495; 252/502, 506, 511

[56] References Cited

U.S. PATENT DOCUMENTS

| | | | |
|---|---|---|---|
| 4,104,600 | 8/1978 | Mayer | 333/12 |
| 4,179,388 | 12/1979 | Rahn et al. | 428/447 |
| 4,555,422 | 11/1985 | Nakamura et al. | 523/137 |

Primary Examiner—John E. Kittle
Assistant Examiner—P. R. Schwartz
Attorney, Agent, or Firm—Wyatt, Gerber, Shoup, Scobey & Badie

[57] ABSTRACT

An electromagnetic shielding material comprising a composition consisting of Mn-Zn ferrite powders, conductive carbon powders and organic high molecular weight compounds. The Mn-Zn ferrite powders may be contained in the range between 30 and 70 vol %. The composition has $10^2$ to $10^{-1}$ ohm.cm of volume resistivity and exhibits excellent electromagnetic absorbing property. The electromagnetic shielding material can prevent transmission of electromagnetic waves and attenuate refleted waves by absorbing the waves.

7 Claims, 4 Drawing Figures

ELECTROMAGNETIC SHIELDING MATERIAL

BACKGROUND OF THE INVENTION

The present invention relates to an electromagnetic shielding material for absorbing electromagnetic energy.

The electromagnetic shielding material is used, for example, as a casing material of an electronic device to prevent the leakage of undesired electromagnetic waves generated in the noise source.

Conventionally, a composite material has been used as the electromagnetic shielding material, which has been prepared by dispersing metal or conductive material is dispersed in a resin. In another case, the shielding material was manufactured by providing conductive coating to the surface of a plastic material by using zinc flame spraying or painting of conductive material.

The conventional shielding material prevents the transmission of the electromagnetic waves by reflecting part of them and absorbing part of them using ohmic loss.

Accordingly, the conventional shielding material has the disadvantage that undesired electromagnetic waves are confined in the electronic device and their intensities increase in the same. This phenomenon leads to an interference between each of the circuits of the electronic device, or to leakage of noise from the electronic device through a connector or air hole where shielding is insufficient.

It is an object of the present invention to overcome the disadvantages of the prior art by providing a new and improved electromagnetic shielding material.

It is another object of the present invention to provide an electromagnetic shielding material with high electromagnetic energy absorbing capability.

According to an aspect of the present invention, there is provided an electromagnetic shielding material having electromagnetic absorbing property comprising a composition consisting of Mn-Zn ferrite powders, conductive carbon powders and organic high molecular weight compounds; the content of the Mn-Zn ferrite powders being in the range between 30 and 70 vol%; and the composition having volume resistivity in the range between $10^2$ and $10^{-1}$ ohm·cm.

DESCRIPTION OF THE PREFERRED EMBODIMENTS

Figure 1:
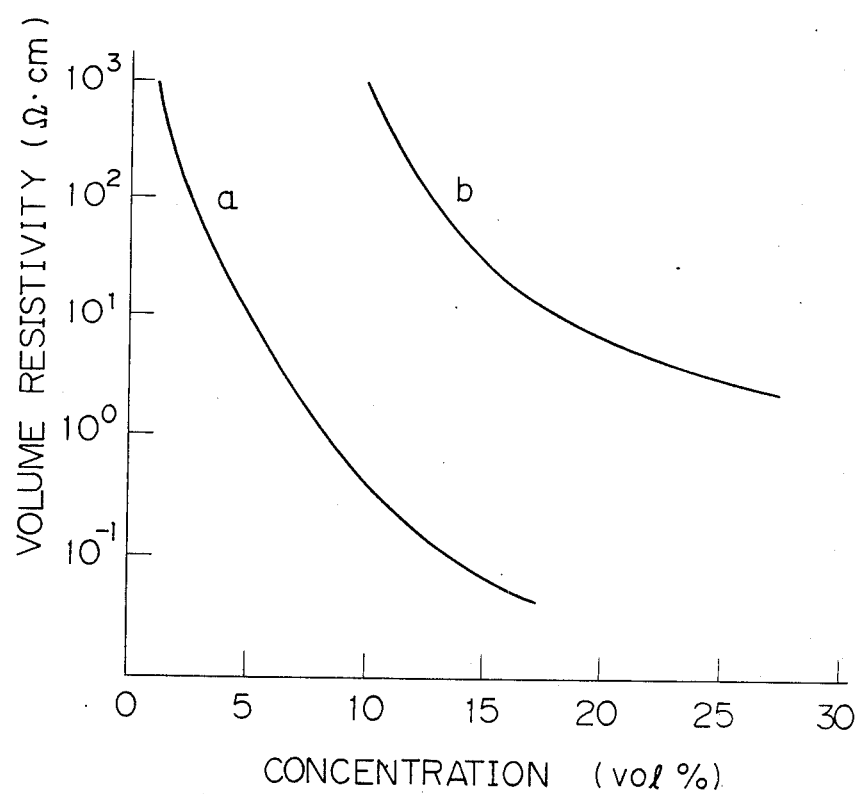
FIG. 1 shows curves between the concentration of carbon black and the volume resistivity of the compositions.

The electromagnetic shielding material with which the present invention is concerned has electromagnetic absorbing property and satisfies the following conditions.

(1) The electromagnetic shielding material comprises the composition which consists of Mn-Zn ferrite powders, conductive carbon powders and organic high molecular weight compounds. The Mn-Zn ferrite powders and the conductive carbon powders are dispersed in the organic high molecular weight compounds (matrix constituent).

(2) The content of the Mn-Zn ferrite powders to the composition is in the range between 30 and 70 vol%.

(3) The volume resistivity of the composition is in the range between $10^2$ and $10^{-1}$ ohm·cm.

The organic high molecular weight compounds used for the composition of this invention may be synthetic resin or synthetic rubber. Among the synthetic resins, thermoplastic resin, thermosetting resin or modified thermoplastic resin is preferably used.

The thermoplastic resin used as the above organic high molecular weight compounds includes, for example, poly-α-olefin such as (low density, high density, or straight chain low density) polyethylene, polypropylene, propylene-ethylene block copolymer or random copolymer; styrene resin such as polystyrene, acrylonitrile-butadiene-styrene terpolymer, styrene-butadiene block copolymer or its hydride; acrylic resin such as polymethyl metacrylate; polyvinyl halide such as polyvinyl chloride; polyamide such as nylon 6, nylon 66; saturated polyester such as polyethylene telephthalate, polybuthylene telephthalate; polyether such as polyphenylene oxide; polysulfone; polyphenylene sulfide; polyvinylidene fluoride, polytetrafluoroethylene; α-olefin-vinyl monomer copolymer such as ethylene-vinyl acetate copolymer, ethylene-acrylate copolymer.

The thermosetting resin used as the above organic high molecular weight compounds includes, for example, epoxy resin, phenol resin, unsaturated polyester resin, melamin resin, polyurethane resin etc., and the mixtures thereof.

The modified thermoplastic resin or the mixture thereof may be also used as the above organic high molecular weight compounds. They are especially suitable for the composition of this invention on account of exhibiting excellent mechanical performance and imparting excellent electromagnetic shielding property to the composition. Such modified thermoplastic resin can be obtained by modifying the thermoplastic resin with unsaturated carboxylic acids or their derivatives. The typical examples of the modified thermoplastic resin are modified polyethylene with maleic anhydride, modified polypropylene with maleic anhydride, etc. And, the examples of the unsaturated carboxylic acids or their derivatives are monobasic carboxylic acids having at most ten carbon atoms and at least one double bond (e.g. acrylic acid, methacrylic acid), dibasic carboxylic acid having at most fifteen carbon atoms and at least one double bond (e.g. maleic acid), and anhydride of the dibasic carboxylic acid (e.g. maleic anhydride). Maleic acid and maleic anhydride are especially preferable among them. The content of the unsaturated carboxylic acids or their derivatives to the thermoplastic resin is in the range between 0.1 and 5 wt%, and more preferably in the range between 0.3 and 3 wt%.

The synthetic rubber used as the above organic high molecular weight compounds includes, for example, ethylene-propylene rubber, styrene-butadiene rubber, isoprene rubber, and the mixtures thereof.

The carbon powders used for the composition of this invention may be carbon black such as furnace black, thermal black, channel black, acetylene black, etc. Ketjen Black (manufactured by AKZO Co., Ltd.) is a typical example of such carbon powders. In order to impart the necessary conductivity to the composition with small loadings, it is preferred to use the carbon powders having the specific surface of more than 900 m²/g evaluated from the nitrogen gas adsorption measured according to BET method.

The combination of carbon black and graphite, or carbon black and carbon fiber may be also used as the conductive carbon powders in the present invention.

The content of the conductive carbon powders to the composition of this invention is determined so that the volume resistivity of the composition is in the range between $10^2$ and $10^{-1}$ ohm·cm. If the carbon black such as Ketjen Black whose specific surface is larger than 900 m²/g is used, the composition having the desired characteristic can be obtained with loadings from 1 to 12 vol%.

FIG. 1 shows the curves between the concentration of carbon black (vol%), and the volume resistivity (ohm·cm) of two composition I and II. In the figure, the curves a and b represent the data of the compositions I and II, respectively. The composition I was obtained by using Ketjen Black whose specific surface is 1000 m²/g, and the composition II was obtained by using Vulkan XC-72 (manufactured by Cabot Co., Ltd.) whose specific suface is 170 m²/g. Both compositions were prepared by using polypropylene as the matrix constituent and 40 vol% of the Mn-Zn ferrite. As can be seen from the figure, for the composition I including Ketjen Black, $9\times10^2$ to $5\times10^1$ ohm·cm of the volume resistivity is obtained with 1 to 4 vol% of Ketjen Black loadings; $5\times10^1$ to $5\times10^0$ ohm·cm of the volume resistivity is obtained with 4 to 7 vol% of the same; and $5\times10^0$ to $1\times10^{-1}$ ohm·cm of the volume resistivity is obtained with 7 to 12 vol% of the same. On the other hand, for the composition II including Vulkan XC-72, $9\times10^2$ to $5\times10^1$ ohm·cm of the volume resistivity is obtained with 10 to 15 vol% of Vulkan XC-72 loadings; and $5\times10^1$ to $5\times10^0$ ohm·cm of the volume resistivity is obtained with 15 to 25 vol% of the same. In this case, however, in order to obtain less than $5\times10^0$ ohm·cm of the volume resistivity, a very large amount of Vulkan XC-72 is required, so that the mixing and shaping process of the composition becomes substantially impossible.

The composition containing Ketjen Black exhibits desired volume resistance with a small amount of its loadings. Moreover, the composition possesses excellent mechanical strength such as Izod impact strength when it is molded. Accordingly, the use of Ketjen Black for this invention is highly suitable.

The Mn-Zn ferrite powders used in the composition of this invention may be in a granular form, a plate form, or a needle form. Preferably, the Mn-Zn ferrite comprises 45 to 60 mol% of $Fe_2O_3$, 10 to 40 mol% of MnO, and 5 to 30 mol% of ZnO. The Mn-Zn ferrite powders have the features (a) saturation magnetic flux density is high, (b) permeability is high, (c) magnetocrystalline anisotropy is small, (d) low frequency characteristic is excellent, and (e) magnetic loss is high.

The Mn-Zn ferrite has superior performance to other type of ferrites. Following Table 1 shows magnetic properties of the composite ferrite A containing the Mn-Zn ferrite representative of soft ferrite in comparison with those of the composite ferrite B containing Ni-Zn ferrite, at the frequency of 500 MHz and 1000 MHz, respectively, where $\mu_r'$ is the real part of the complex permeability $\mu_r(=\mu_r'-j\mu_r''; j=\sqrt{-1})$, $\mu_r''$ is the imaginary part of the same and which represents the magnetic loss. Mixing volume ratio of each ferrite to the matrix resin is 0.5.

TABLE 1

| | Frequency | | | |
|---|---|---|---|---|
| | 500 MHz | | 1000 MHz | |
| | $\mu_r'$ | $\mu_r''$ | $\mu_r'$ | $\mu_r''$ |
| Composite ferrite A (Mn—Zn ferrite) | 5.2 | 2.7 | 3.9 | 3.6 |
| Composite ferrite B (Ni—Zn ferrite) | 4.2 | 1.5 | 3.3 | 1.7 |

As demonstrated by the result shown in the table 1, the magnetic loss of the composite ferrite A is about twice as large as that of the composite ferrite B. Accordingly, it can be seen that the composite ferrite A is more suitable for this invention.

As mentioned heretobefore, the content of the Mn-Zn ferrite powders to the composition of this invention is preferably in the range between 30 and 70 vol%, and is more preferably in the range between 40 and 60 vol%. When the content is less than 30 vol%, the electromagnetic absorbing propertry becomes insufficient, and when it exceeds 70 vol%, the shaping process and mechanical strength are considerably deteriorated.

Also as mentioned heretobefore, the volume resistivity of the composition of this invention is preferably in the range between $10^2$ and $10^{-1}$ ohm·cm, and is more preferably in the range between 1 and $10\times10^0$ ohm·cm. When the volume resistivity exceeds $10^2$ ohm·cm, the electromagnetic shielding property becomes insufficient, and when it is less than $10^{-1}$ ohm·cm, the reflection amount increases undesiredly. In order to attain the object of this invention, it is required to reduce the reflection amount as possible, as well as to improve the electromagnetic shielding property as possible. Such requirements can be satisfied with the composition having the volume resistivity in the above range.

As a modification of the present invention, the composition may include inert filler in addition to the organic high molecular weight compounds, the Mn-Zn ferrite powders and the conductive carbon powders. Such an inert filler may be inorganic or organic nonconductive one, which includes, for example, calcium carbonate, talc, mica, barium sulfate, titanium oxide, clay, silica, magnesium carbonate, starch, etc.

The composition of this invention can be obtained by using a batch type mixer such as a Banbury type mixer, a roll mixer, a Brabender plastograph, or a continuous operated extruder such as a uniaxial extruder, a biaxial extruder. The blending procedure of the components of the composition may be in any order. For example, the components may be blended at a time, or part of them may be firstly pre-blended and thereafter the reminder may be blended in the preblend.

The following specific example further illustrates the magnetic shielding material of this invention, but it is to be understood that the invention is not to be limited to the details thereof.

EXAMPLE

Before illustrating the example of the composition of this invention, the manufacturing procedure of the Mn-Zn ferrite powders used in this invention will be described by way of the following example.

$Fe_2O_3$ powders, ZnO powders and MnO powders were each weighed out to provide Mn-Zn ferrite including 53 mol% of $Fe_2O_3$, 13 mol% of ZnO and 34 mol% of MnO. These powders were put into a ball mill together with water and steel balls having a diameter of 0.5 inches so that the weight ratio of the powders, the water and the steel balls is 1:2:2, and were mixed for 20 hours. Then, the mixture was dried with a drying device, and were sintered in a sintering furnace to produce the Mn-Zn ferrite. The sintering was performed at a temperature of 1350° C. for two hours and in an atomosphere having an oxygen concentration of 5%. After the sintering, the Mn-Zn ferrite was put into a ball mill together with water and steel balls so that the weight ratio of them is 1:2:2, and was ground for 20 hours. Then, the resulting ferrite powders were dried with a drying device, and thereafter were pulverized by a pulverizer to obtain the desired Mn-Zn ferrite powders having average particle size of about 3 microns.

Next, the example of the electromagnetic shielding material of this invention will be described. The material was prepared as follows:

47 vol% of modified polypropylene with maleic anhydride, 7 vol% of carbon black (Ketjen Black) having specifid surface of 1000 $m^2/g$ measured by BET method, and 46 vol% of Mn-Zn ferrite prepared by the above procedure were mixed, and the mixture was extruded and pelletized by a biaxial extruder. Then the pellet was compression molded to obtain sheet-like shaped body of the electromagnetic shielding material having a thickness of 3 mm.

The following table 2 shows the characteristics of thus obtained electromagnetic shielding material of this invention, together with those of three comparative examples. In this table, the materials No. 1, No. 2, No. 3 and No. 4 represent the electromagnetic shielding material according to this invention, the first comparative example, the second comparative example and the third comparative example, respectively. The material No. 2 does not contain the ferrite powders; The material No. 3 does not contain the carbon powders; The material No. 4 contains polypropylene as the matrix resin. The modified polypropylene in the materials No. 1 to No. 3 is obtained by modifying polypropylene with 0.9 wt% of maleic anhydride. The thickness of each material is 3 mm.

TABLE 2

| Magnetic Shielding Material No. | | No. 1 | No. 2 | No. 3 | No. 4 |
| --- | --- | --- | --- | --- | --- |
| Mixing Ratio (vol %) | Mn—Zn ferrite powders | 46 | | 46 | 46 |
| | carbon black | 7 | 13 | | 7 |
| | modified polypropylene | 47 | 87 | 54 | |
| | Polypropylene | | | | 47 |
| Volume Resitivity (ohm · cm) | | $5.5 \times 10^0$ | $4 \times 10^{-1}$ | $1 \times 10^8$ | $7.0 \times 10^1$ |
| Transmission Amount (dB) (at 1000 MHz) | | −21.8 | −45 | −4.0 | −10.0 |
| Reflection Amount (dB) (at 1000 MHz) | | −4.8 | 0 | −6.0 | −8.5 |

Figure 2:
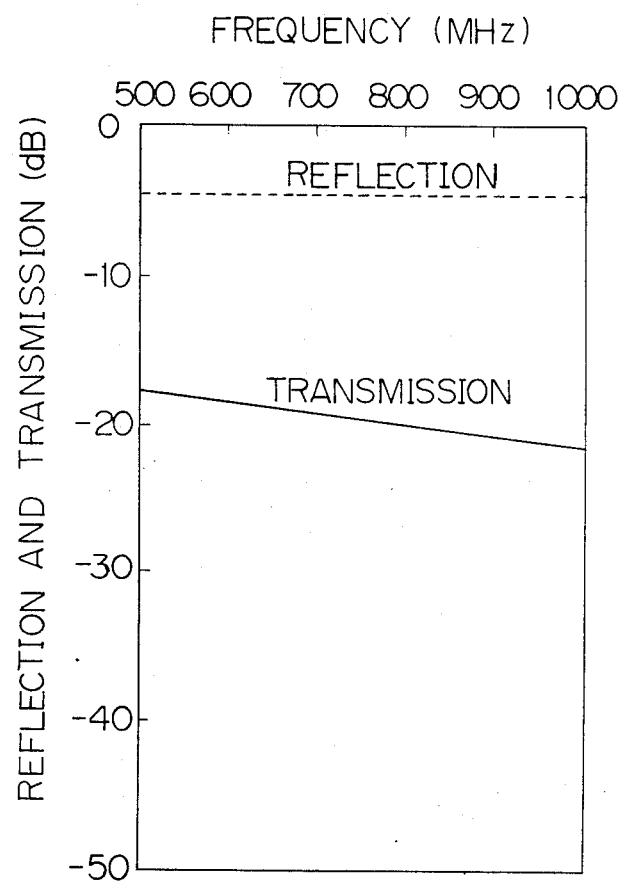
FIG. 2 to FIG. 4 show the relationship between the reflection amount and transmission amount of electromagnetic waves and the frequency in the present shielding material and the comparative examples.
Figure 3:
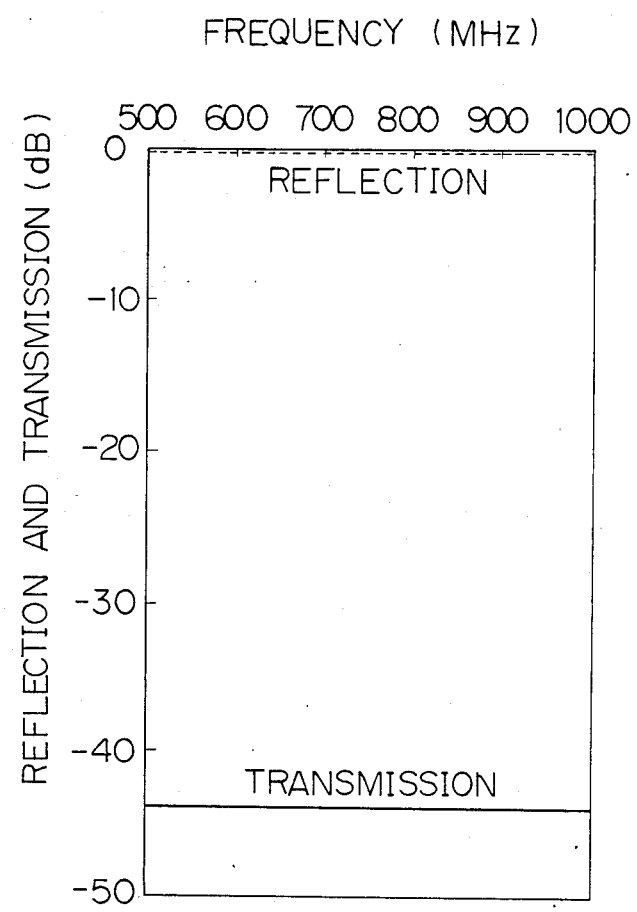
Figure 4:
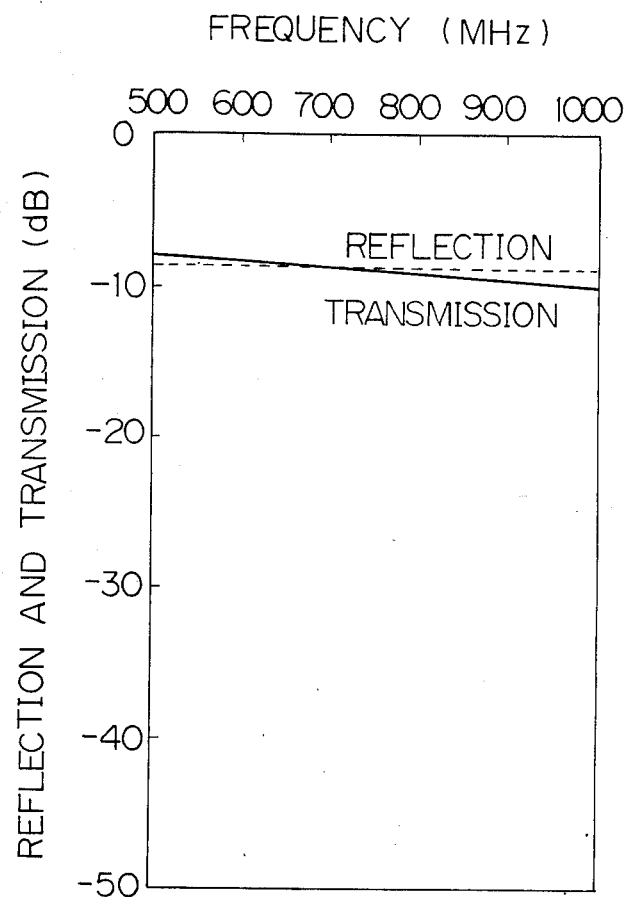

FIGS. 2 to 4 show the relationship between the absorbing characteristics (the transmission amount and reflection amount) and the frequency concerning the materials No. 1, No. 2 and No. 4, respectively.

As can be seen from the above results, the material No. 1 exhibits small transmission amount and small reflection amount (see FIG. 2); the material No. 2 exhibits small transmission amount and large reflection amount (see FIG. 3); and the material No. 4 has poor electromagnetic shielding property in comparison with the material No. 1 (see FIG. 4). Accordingly, it can be understood that the material No. 1 according to this invention has more excellent electromagnetic absorbing property than other three comparative examples.

Moreover, as shown in the table 3, the mechanical performance of the material No. 1 using modified polypropylene with maleic anhydride superior to those of the material No. 4 using polypropylene.

TABLE 3

| | Unit | No. 1 | No. 4 |
| --- | --- | --- | --- |
| Three Point Bending[1] Modulus of Elasticity | $Kg/cm^2$ | 108,800 | 56,000 |
| Maximum Bending[2] Strength | $Kg/cm^2$ | 740 | 480 |
| Tensile Strength[3] at Break | $Kg/cm^2$ | 380 | 320 |

Measurement
[1] JIS-K7203
[2] JIS-K7203
[3] JIS-K7113

What is claimed is:

1. An electromagnetic shielding material for forming a sheet having electromagnetic absorbing property, the said material comprising a composition in which MN-ZN ferrite powders and conductive carbon black powders are dispersed in a matrix of organic high molecular weight compounds, the content of the MN-ZN ferrite powders being in the range between 30 and 70 vol percent, the content of the carbon black powders being in the range between 1 and 12 vol percent, the composition having a volume resistivity in the range between 100 and 1/10 ohm/cm, and the carbon black powders having the specific surface of more than 900 $m^2/g$.

2. The material according to claim 1, in which the organic high molecular weight compounds are synthetic resin.

3. The material according to claim 2, in which the synthetic resin is thermoplastic resin.

4. The material according to claim 3, in which the thermoplastic resin is modified.

5. The material according to claim 4, in which the modified thermoplastic resin is produced by modifying the thermoplastic resin with unsaturated carboxylic acids or their derivatives.

6. The material according to claim 2, in which the synthetic resin is thermosetting resin.

7. The material according to claim 1, in which the organic high molecular weight compounds are synthetic rubber.

* * * * *